(12) United States Patent
Ikeda (10) Patent No.: US 8,717,730 B2
(45) Date of Patent: May 6, 2014

(54) ESD PROTECTION DEVICE AND METHOD FOR PRODUCING THE SAME

(75) Inventor: Tetsuya Ikeda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 161 days.

(21) Appl. No.: 13/106,921

(22) Filed: May 13, 2011

(65) Prior Publication Data

US 2011/0286142 A1 Nov. 24, 2011

(30) Foreign Application Priority Data

May 20, 2010 (JP) ................................. 2010-116346

(51) Int. Cl.
*H05F 3/00* (2006.01)

(52) U.S. Cl.
USPC ............................. 361/112; 361/220; 361/56

(58) Field of Classification Search
None
See application file for complete search history.

(56) References Cited

U.S. PATENT DOCUMENTS

| | | | |
|---|---|---|---|
| 3,900,767 A * | 8/1975 | Person ........................... | 361/118 |
| 5,694,284 A | 12/1997 | Oda et al. | |
| 5,726,854 A * | 3/1998 | Maki et al. .................... | 361/120 |
| 6,052,267 A * | 4/2000 | Kasai et al. .................... | 361/56 |
| 6,721,157 B2 * | 4/2004 | Shin .............................. | 361/120 |
| 7,277,003 B2 * | 10/2007 | Inoue et al. .................... | 338/20 |
| 7,894,172 B2 * | 2/2011 | Pan et al. ....................... | 361/56 |
| 8,514,536 B2 * | 8/2013 | Sawada et al. ................. | 361/56 |
| 2002/0008952 A1 * | 1/2002 | Shin .............................. | 361/112 |
| 2003/0184985 A1 * | 10/2003 | Oshima et al. ................ | 361/760 |
| 2005/0143262 A1 * | 6/2005 | Hirose et al. .................. | 505/100 |
| 2006/0209485 A1 * | 9/2006 | Imai et al. ...................... | 361/120 |
| 2007/0070569 A1 * | 3/2007 | Chida et al. .................... | 361/118 |
| 2008/0049370 A1 | 2/2008 | Adachi et al. | |
| 2008/0180017 A1 * | 7/2008 | Imai et al. ................ | 313/231.11 |
| 2008/0241488 A1 * | 10/2008 | Ohta et al. ..................... | 428/198 |
| 2009/0067113 A1 * | 3/2009 | Urakawa ........................ | 361/220 |
| 2010/0254052 A1 * | 10/2010 | Katsumura et al. ............. | 361/56 |
| 2010/0309595 A1 * | 12/2010 | Adachi et al. ................... | 361/56 |
| 2011/0026186 A1 | 2/2011 | Katsumura et al. | |
| 2011/0038088 A1 * | 2/2011 | Noma et al. ................... | 361/112 |
| 2011/0089541 A1 * | 4/2011 | Shau ............................. | 257/660 |
| 2011/0216456 A1 * | 9/2011 | Yamamoto et al. ............. | 361/56 |
| 2012/0250196 A1 * | 10/2012 | Sumi et al. ...................... | 361/56 |

FOREIGN PATENT DOCUMENTS

| | | |
|---|---|---|
| JP | 08-017548 A | 1/1996 |
| JP | 10-022043 A | 1/1998 |
| JP | 10-312876 A | 11/1998 |
| JP | 2006-049065 A | 2/2006 |
| JP | 2009-301819 A | 12/2009 |
| WO | 2008/146514 A1 | 12/2008 |

* cited by examiner

*Primary Examiner* — Jared Fureman
*Assistant Examiner* — Angela Brooks
(74) *Attorney, Agent, or Firm* — Keating & Bennett, LLP (57) ABSTRACT

An ESD protection device includes an insulating ceramic substrate excluding a glass ceramic substrate, first and second discharge electrodes provided on the insulating ceramic substrate and including respective edges that face each other with a gap therebetween, and a discharge supporting electrode provided on the insulating ceramic substrate so as to electrically connect the first and second discharge electrodes to each other, the discharge supporting electrode including a ceramic material and metal particles whose surfaces are coated with insulating inorganic material powder. A thermosetting resin-cured layer including a cavity is provided on the insulating ceramic substrate so that the portions of the first and second discharge electrodes that face each other with a gap therebetween are present in the cavity.

12 Claims, 5 Drawing Sheets

ESD PROTECTION DEVICE AND METHOD FOR PRODUCING THE SAME

BACKGROUND OF THE INVENTION

1. Field of the Invention

The present invention relates to an electrostatic discharge (ESD) protection device used to protect semiconductor devices and electronic circuits from static electricity and a method for producing the ESD protection device. More specifically, the present invention relates to an ESD protection device including first and second discharge electrodes that face each other with a gap therebetween in a cavity and a method for producing the ESD protection device.

2. Description of the Related Art

Various ESD protection devices have been used to protect semiconductor devices and electronic circuits from static electricity.

Figure 5A:
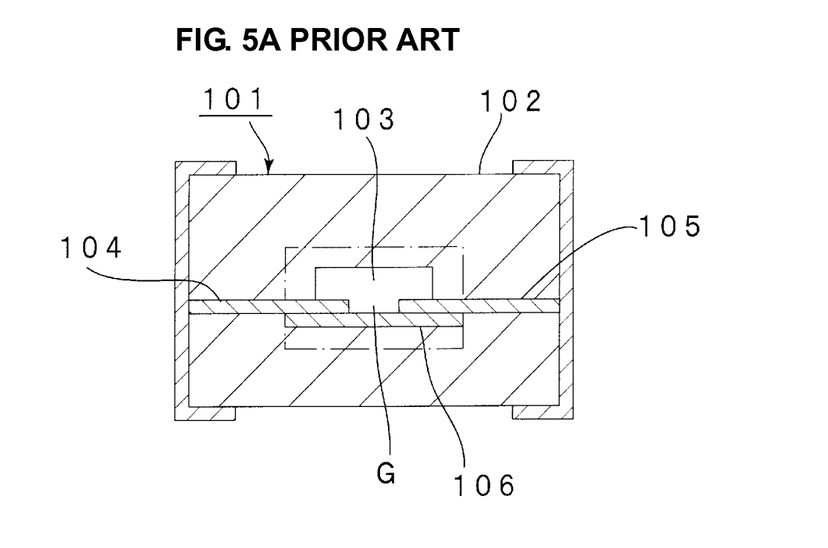
FIGS. 5A and 5B are front sectional views for describing a known ESD protection device.
Figure 5B:
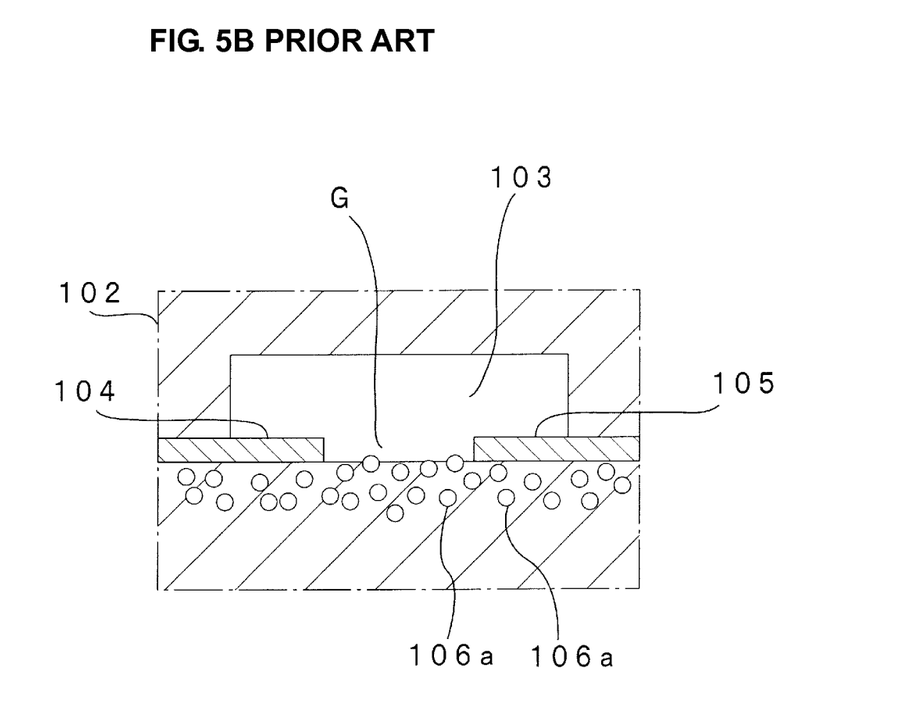

For example, International Publication No. WO2008/146514 discloses an ESD protection device shown in FIGS. 5A and 5B. An ESD protection device 101 includes a ceramic multilayer substrate 102. The ceramic multilayer substrate 102 is made of glass ceramic, that is, low temperature co-fired ceramic (LTCC). A cavity 103 is provided in the ceramic multilayer substrate 102. A first discharge electrode 104 and a second discharge electrode 105 are disposed in the ceramic multilayer substrate 102. The respective edges of the first and second discharge electrodes 104 and 105 are located in the cavity 103. As shown in FIG. 5A, the edges of the first and second discharge electrodes 104 and 105 face each other with a gap G provided therebetween in the cavity 103. A mixture portion 106 is disposed on the lower surface of the cavity 103. The mixture portion 106 is in contact with the lower surfaces of the first and second discharge electrodes 104 and 105 so as to connect the first discharge electrode 104 with the second discharge electrode 105.

FIG. 5B shows the details of the mixture portion 106. In the mixture portion 106, conductive particles 106a coated with an inorganic material having no conductivity are dispersed in a ceramic material. The mixture portion 106 is disposed in order to easily achieve creeping discharge between the first and second discharge electrodes. Thus, the discharge starting voltage can be decreased. The mixture portion 106 functions as a discharge supporting electrode.

In the ESD protection device and the method for producing the ESD protection device disclosed in International Publication No. WO2008/146514, a glass ceramic substrate is fired while a material used to form a cavity is provided in the glass ceramic substrate. Therefore, when a cavity is formed by the elimination of the material used to form a cavity, glass included in the glass ceramic substrate sometimes enters the discharge supporting electrode, which is the mixture portion 106. As a result, an undesired short circuit is caused between the first and second discharge electrodes and, thus, the protection from static electricity cannot be achieved with certainty.

SUMMARY OF THE INVENTION

To overcome the problems described above, preferred embodiments of the present invention provide an ESD protection device including a discharge supporting electrode that connects first and second discharge electrodes to each other, in which an undesired short circuit is prevented between the first and second discharge electrodes and, thus, the protection from static electricity can be effectively achieved with certainty, and a method for producing the ESD protection device.

An ESD protection device according to a preferred embodiment of the present invention preferably includes an insulating ceramic substrate excluding a glass ceramic substrate and a thermosetting resin-cured layer provided on the insulating ceramic substrate. The thermosetting resin-cured layer preferably includes a cavity that faces an interface between the thermosetting resin-cured layer and the insulating ceramic substrate. The ESD protection device preferably further includes first and second discharge electrodes provided on the insulating ceramic substrate and including respective edges that face each other with a gap therebetween, the edges and the gap being exposed in the cavity, and a discharge supporting electrode arranged so as to electrically connect the first and second discharge electrodes to each other, the discharge supporting electrode including a ceramic material and metal particles whose surfaces are coated with insulating inorganic material powder.

In the ESD protection device according to a preferred embodiment of the present invention, the ceramic material included in the discharge supporting electrode is preferably made of semiconductor particles. In this case, the discharge starting voltage can be decreased with more certainty due to the discharge supporting electrode. Thus, the protection from static electricity is achieved with more certainty.

In the ESD protection device according to another preferred embodiment of the present invention, the thermosetting resin-cured layer is preferably a cured layer of a thermosetting resin that is provided in a portion of an upper surface of the insulating ceramic substrate by potting. In this case, a thermosetting resin can be easily provided on the insulating ceramic substrate by potting. Thus, the cost of the ESD protection device is reduced.

In the ESD protection device according to another preferred embodiment of the present invention, the thermosetting resin-cured layer may preferably be a thermosetting resin-cured layer that is laminated over the entire or substantially the entire upper surface of the insulating ceramic substrate.

In the ESD protection device according to another preferred embodiment of the present invention, the insulating ceramic substrate is preferably an alumina substrate. In this case, an alumina substrate is readily available at low cost.

A method for producing an ESD protection device according to another preferred embodiment of the present invention preferably includes a step of preparing an insulating ceramic substrate excluding a glass ceramic substrate, a step of applying a paste used to form a discharge supporting electrode on the insulating ceramic substrate, the paste including a ceramic material and metal particles whose surfaces are coated with insulating inorganic material powder, a step of applying an electrode paste used to form first and second discharge electrodes on the insulating ceramic substrate, a step of firing the paste used to form the discharge supporting electrode so as to form the discharge supporting electrode, a step of firing the electrode paste the first and second discharge electrodes to form first and second discharge electrodes, a step of providing a material used to form a cavity in a region including respective edges of the first and second discharge electrodes and a gap provided between the edges, the material used to form the cavity being a material that is eliminated during heating, a step of providing a thermosetting resin on the insulating ceramic substrate in a region including the region in which the material used to form the cavity has been provided, and a step of curing, by heating, the thermosetting resin and eliminating the material used to form the cavity so as to form the cavity.

In the method for producing an ESD protection device according to a preferred embodiment of the present invention, the ceramic material included in the discharge supporting electrode is preferably made of semiconductor particles. In this case, the discharge starting voltage can be further decreased. Thus, with this ESD protection device, the protection from static electricity is achieved with more certainty.

In the method for producing an ESD protection device according to a preferred embodiment of the present invention, the step of firing the paste used to form the discharge supporting electrode and the step of firing the electrode paste used to form the first and second discharge electrodes may preferably be performed simultaneously or separately.

In the method for producing an ESD protection device according to another preferred embodiment of the present invention, the step of providing the thermosetting resin is preferably performed by potting a thermosetting resin on the insulating ceramic substrate. In this case, a thermosetting resin can be easily provided on the insulating ceramic substrate by potting.

In the method for producing an ESD protection device according to another preferred embodiment of the present invention, the step of providing the thermosetting resin is preferably performed by coating the entire or substantially the entire upper surface of the insulating ceramic substrate with a thermosetting resin layer. In this case, a thermosetting resin layer having a desired shape is formed. Thus, an ESD protection device including an electronic component having a general shape, such as a shape of a substantially rectangular parallelepiped or a substantially rectangular plate, for example, can be produced. Furthermore, variations in the external shape of the ESD protection device can be effectively reduced.

In the method for producing an ESD protection device according to another preferred embodiment of the present invention, the insulating ceramic substrate is preferably an alumina substrate. In this case, an alumina substrate is readily available at low cost.

In the ESD protection device and the method for producing the ESD protection device according to various preferred embodiments of the present invention, since an insulating ceramic substrate that does not include a glass ceramic substrate is preferably used, a glass component does not enter the discharge supporting electrode during the formation of the cavity even if heat is applied. Therefore, the discharge starting voltage can be decreased due to the discharge supporting electrode and an undesired short circuit is prevented. Thus, an ESD protection device having high reliability is provided. Furthermore, since the entrance of the glass component is prevented, a sealing layer arranged to prevent the entrance of the glass component is not required.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will now be described with reference to the attached drawings.

Figure 1A:
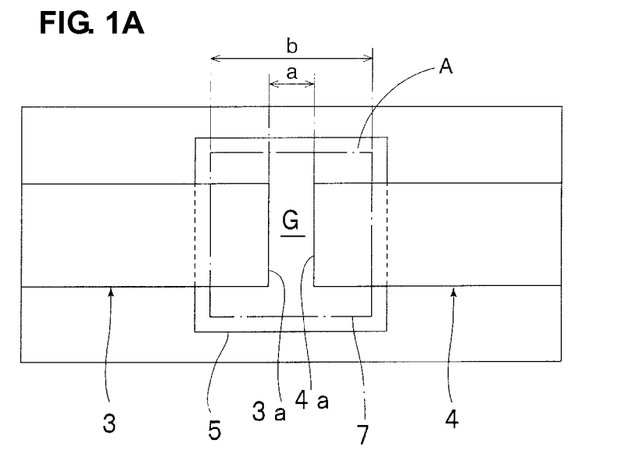
FIG. 1A is a sectional plan view of an ESD protection device according to a first preferred embodiment of the present invention.
Figure 1B:
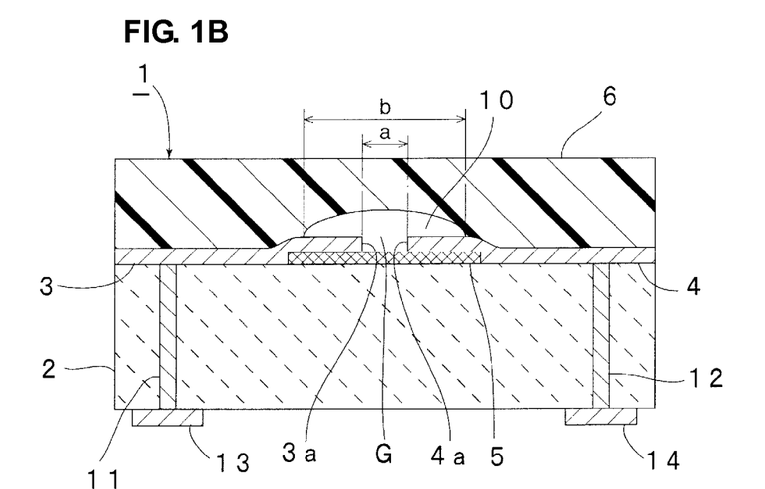
FIG. 1B is a front sectional view of the ESD protection device according to the first preferred embodiment of the present invention.
Figure 1C:
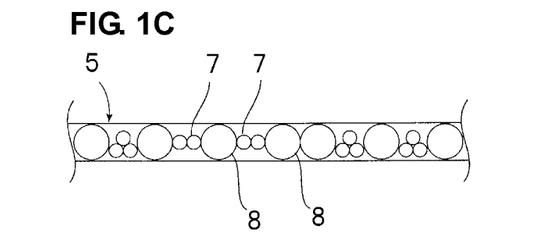
FIG. 1C is a partially cutaway enlarged sectional view to describe the details of a discharge supporting electrode.

FIG. 1A is a plan view showing the state in which a thermosetting resin-cured layer is removed in a first preferred embodiment of the present invention. FIG. 1B is a front sectional view of an ESD protection device according to the first preferred embodiment. FIG. 1C is a partially cutaway enlarged sectional view showing the details of a discharge supporting electrode.

As shown in FIG. 1B, an ESD protection device 1 preferably includes an insulating ceramic substrate 2. The insulating ceramic substrate 2 is preferably made of insulating ceramic other than glass ceramic. Glass ceramic is, for example, ceramic including a glass component, such as low temperature co-fired ceramic (LTCC) disclosed in International Publication No. WO2008/146514. In this preferred embodiment, alumina preferably is used as the insulating ceramic other than glass ceramic, for example. Mullite, zirconia, or other suitable ceramic materials may be used, instead of alumina.

First and second discharge electrodes 3 and 4 are provided on the insulating ceramic substrate 2. Respective edges 3a and 4a of the first and second discharge electrodes 3 and 4 face each other with a gap G therebetween. The size of the gap G in the direction in which the edges 3a and 4a face each other is assumed to be a.

The first and second discharge electrodes 3 and 4 may be formed by any appropriate electrode-forming method. However, in this preferred embodiment, the first and second discharge electrodes 3 and 4 are preferably formed by firing an electrode paste, for example. An electrode paste including metal powder used to form an electrode and a small amount of glass frit can be used as the electrode paste. Examples of a material of the metal powder include base metals, such as Cu and Ni and precious metals, such as Ag, Au, and a AgPd alloy. When a base metal is used, the cost is reduced.

A discharge supporting electrode 5 is preferably provided on the upper surface of the insulating ceramic substrate 2. The discharge supporting electrode 5 is arranged so as to electrically connect the first discharge electrode 3 with the second discharge electrode 4. In this preferred embodiment, preferably, the discharge supporting electrode 5 is provided and then the first and second discharge electrodes 3 and 4 are provided. Thus, respective portions of the first and second discharge electrodes 3 and 4 near the edges 3a and 4a are arranged on the discharge supporting electrode 5. Herein, the discharge supporting electrode 5 may be provided after the first and second discharge electrodes 3 and 4 have been provided. Therefore, the discharge supporting electrode 5 may be arranged so as to be disposed on the upper surfaces of the first and second discharge electrodes 3 and 4.

The discharge supporting electrode 5 preferably includes a ceramic material and metal particles whose surfaces are coated with insulating inorganic material powder.

FIG. 1C is a partially cutaway enlarged sectional view schematically showing the details of the discharge supporting electrode 5. As described above, metal particles 8 coated with inorganic material powder having no conductivity and a ceramic material 7 are dispersed in the discharge supporting electrode 5. The metal particles 8 are preferably made of a metal, such as Cu or Ni or an alloy, for example. The diameter of the metal particles 8 is not particularly limited, but is preferably about μm 2 to about 3 μm, for example. The inorganic material powder is not particularly limited, and an insulating inorganic material is preferably suitably used, for example. An example of the inorganic material is $Al_2O_3$, for example.

The diameter of the inorganic material powder is preferably less than that of the metal particles 8. For example, $Al_2O_3$ particles having a diameter of about several nanometers to several tens of nanometers are preferably used.

In this preferred embodiment, the ceramic material 7 is preferably made of silicon carbide, for example. In addition to silicon carbide, various ceramic materials can be used as the ceramic material 7 in the discharge supporting electrode 5. To improve the responsivity to ESD, the ceramic material 7 is preferably made of particles of semiconductor ceramic. Examples of the semiconductor ceramic include carbides, such as titanium carbide, zirconium carbide, molybdenum carbide, and tungsten carbide; nitrides, such as titanium nitride, zirconium nitride, chromium nitride, vanadium nitride, and tantalum nitride; silicides, such as titanium silicide, zirconium silicide, tungsten silicide, molybdenum silicide, and chromium silicide; borides, such as titanium boride, zirconium boride, chromium boride, lanthanum boride, molybdenum boride, and tungsten boride; and oxides, such as zinc oxide and strontium titanate. In particular, silicon carbide is preferably used because it is commercially available with various particle sizes at relatively low cost.

The ceramic material 7 made of the above-described semiconductor ceramic may be used alone or in combination with two or more types. Furthermore, the ceramic material 7 made of the above-described semiconductor ceramic may be suitably used together with an insulating ceramic material, such as alumina, for example, in a mixture.

The electrode material defining the first and second discharge electrodes 3 and 4 can be suitably selected from Ag, Pd, Pt, Al, Ni, and W, in addition to Cu, for example.

Since the metal particles 8 whose surfaces are coated with the insulating inorganic material powder are dispersed in the discharge supporting electrode 5, the discharge starting voltage in the case of the discharge that utilizes creeping discharge generated between the edge 3a of the first discharge electrode 3 and the edge 4a of the second discharge electrode 4 is reduced. Thus, the protection from static electricity is more effectively achieved.

The ceramic material 7 may preferably be made of the same ceramic as that of a material that defines the insulating ceramic substrate 2. In this case, the shrinkage behavior of the discharge supporting electrode 5 during firing can be substantially matched with that of the insulating ceramic substrate 2.

The metal particles 8 defining the discharge supporting electrode 5 are not particularly limited, but are preferably made of the same metal as that defining the first and second discharge electrodes 3 and 4. With this configuration, the coefficient of linear expansion of the discharge supporting electrode 5 is similar to that of the first and second discharge electrodes 3 and 4.

As described in the production method below, the following combination is preferred in order to prevent the oxidation of metal when a paste used to form the discharge supporting electrode 5 and an electrode paste used to form the first and second discharge electrodes 3 and 4 are printed and then simultaneously fired.

For example, when the metal defining the first and second discharge electrodes 3 and 4 is a non-oxidative precious metal, such as Ag, Au, or an AgPd alloy, the metal defining the discharge supporting electrode 5 is also preferably a non-oxidative precious metal. Thus, a common firing atmosphere can be used.

When the first and second discharge electrodes 3 and 4 and the discharge supporting electrode 5 are formed by co-firing, when the first and second discharge electrodes 3 and 4 are made of an oxidative base metal, such as Cu or Ni, the firing atmosphere must be a neutral or reducing atmosphere or a low-oxygen-concentration atmosphere. In this case, the discharge supporting electrode 5 is preferably made of a base metal, such as Cu or Ni, for example. This reduces the cost. In this case, the discharge supporting electrode 5 may be made of a non-oxidative precious metal, such as Ag and Au, for example.

When the first and second discharge electrodes 3 and 4 and the discharge supporting electrode 5 are separately fired, different firing atmospheres may be used. In this case, the combination between the metal defining the first and second discharge electrodes 3 and 4 and the metal defining the discharge supporting electrode 5 is not particularly limited. However, when the metal defining the first and second discharge electrodes 3 and 4 is a base metal, the metal defining the discharge supporting electrode 5 is preferably a base metal. This reduces the cost, and a common firing atmosphere may be used.

A thermosetting resin-cured layer 6 is preferably provided on the insulating ceramic substrate 2 so as to cover the first and second discharge electrodes 3 and 4 and the discharge supporting electrode 5. The thermosetting resin-cured layer 6 is preferably made of a cured material of a thermosetting resin, such as an epoxy resin or a phenol resin, for example. A cavity 10 is provided in the thermosetting resin-cured layer 6. The cavity 10 is an opening that is provided at a lower portion of the thermosetting resin-cured layer 6. The edges 3a and 4a of the first and second discharge electrodes 3 and 4 are exposed in the cavity 10.

In the region between the edge 3a of the first discharge electrode 3 and the edge 4a of the second discharge electrode 4, that is, in the gap G, the discharge supporting electrode 5 is exposed in the cavity 10. The size of the cavity 10 in the direction in which the first and second discharge electrodes 3 and 4 face each other is assumed to be b.

The size of the discharge supporting electrode 5 in that direction is preferably greater than the size b. In other words, as shown in FIG. 1A, the cavity 10 is provided within a region in which the discharge supporting electrode 5 is disposed when viewed in plan. Therefore, when static electricity is applied, creeping discharge between the edge 3a of the first discharge electrode 3 and the edge 4a of the second discharge electrode 4 is easily produced due to the discharge supporting electrode 5. Since the discharge supporting electrode 5 is provided, the discharge starting voltage can be further decreased. Thus, the protection from static electricity is achieved with certainty.

Via hole electrodes 11 and 12 are preferably provided in the insulating ceramic substrate 2. The via hole electrodes 11 and 12 are arranged so as to penetrate between the upper surface and lower surface of the insulating ceramic substrate 2. The top ends of the via hole electrodes 11 and 12 are connected to the first and second discharge electrodes 3 and 4, respectively.

Terminal electrodes 13 and 14 are preferably provided on the lower surface of the insulating ceramic substrate 2. The terminal electrodes 13 and 14 are connected to the bottom ends of the via hole electrodes 11 and 12, respectively. The ESD protection device 1 can be electrically connected to the outside using the terminal electrodes 13 and 14.

The via hole electrodes 11 and 12 and the terminal electrodes 13 and 14 can be made of a base metal, such as Cu or Al, a precious metal, such as Ag or Au, or an alloy thereof, for example.

In the ESD protection device 1 according to this preferred embodiment, not only the creeping discharge but also gaseous discharge in the cavity 10 is preferably used. If only the creeping discharge is used, the discharge characteristics are degraded when static electricity is repeatedly applied. In contrast, when the cavity 10 is provided, gaseous discharge can also be used. Therefore, even if static electricity is repeatedly applied, discharge is generated with certainty and the degradation of the discharge characteristics of the ESD protection device 1 is prevented.

In the ESD protection device 101 disclosed in International Publication No. WO2008/146514, the ceramic multilayer substrate is made of glass ceramic, that is, low temperature co-fired ceramic. Therefore, a glass component enters the discharge supporting electrode during firing, which causes an undesired short circuit.

In the ESD protection device 1 according to this preferred embodiment, the insulating ceramic substrate 2 is preferably made of insulating ceramic other than glass ceramic and the thermosetting resin-cured layer 6 is provided over the cavity 10. Thus, a glass component is very unlikely to enter the discharge supporting electrode 5 and an undesired short circuit is prevented with certainty.

A sealing layer is considered to be provided in order to suppress the seepage of the glass component from the ceramic side. That is, a sealing layer is considered to be provided between a discharge supporting electrode and an insulating ceramic substrate in order to prevent a glass component from entering the discharge supporting electrode. However, such a structure including the sealing layer is complicated and, thus, the cost is increased. In this preferred embodiment, a short circuit caused by deterioration of the discharge supporting electrode 5 is prevented with certainty without providing a sealing layer.

An example of a method for producing the ESD protection device 1 will now be described. The method for producing the ESD protection device 1 is not limited to the example below.

First, an insulating ceramic substrate 2 made of insulating ceramic excluding a glass ceramic is prepared. A paste used to form a discharge supporting electrode 5 is applied on the insulating ceramic substrate 2 by an appropriate method, such as screen printing, for example. An electrode paste used to form first and second discharge electrodes 3 and 4 is applied thereon by screen printing or other suitable method.

The paste used to form a discharge supporting electrode 5 and the electrode paste used to form first and second discharge electrodes 3 and 4 are fired to produce first and second discharge electrodes 3 and 4 and a discharge supporting electrode 5. When the first and second discharge electrodes 3 and 4 and the discharge supporting electrode 5 are formed of a precious metal, such as Ag, Au, or a AgPd alloy, for example, the firing may be performed in an appropriate atmosphere, such as in the air. When the first and second discharge electrodes 3 and 4 and the discharge supporting electrode 5 are formed of a base metal, such as Cu or Ni, the firing needs to be performed in an atmosphere with an oxygen concentration of about 5 ppm or less, that is, in a non-oxidizing atmosphere.

The firing may be performed at about 800° C. to about 900° C. for about 10 to about 30 minutes, for example, although the temperature and time depend on the metal used.

A material used to form a cavity is applied at a position in which a cavity 10 is to be formed. A material to be eliminated at a temperature at which a thermosetting resin described below is cured by heating can preferably be used as the material used to form a cavity. An example of the material is wax, such as paraffin wax. The method for applying the material used to form a cavity is not particularly limited, and an appropriate method, such as potting, can preferably be used, for example.

After the material used to form a cavity is provided, a thermosetting resin is applied. The thermosetting resin can be applied by an appropriate method, such as a method that uses a dispenser, for example.

Subsequently, the thermosetting resin is heated to a temperature greater than or equal to the curing temperature thereof. In this manner, the thermosetting resin is cured to form a thermosetting resin-cured layer 6 made of a thermosetting resin-cured material. In this curing process, the material used to form a cavity is melted and impregnated into the thermosetting resin. Thus, a cavity 10 is formed after the curing process.

Figure 2A:
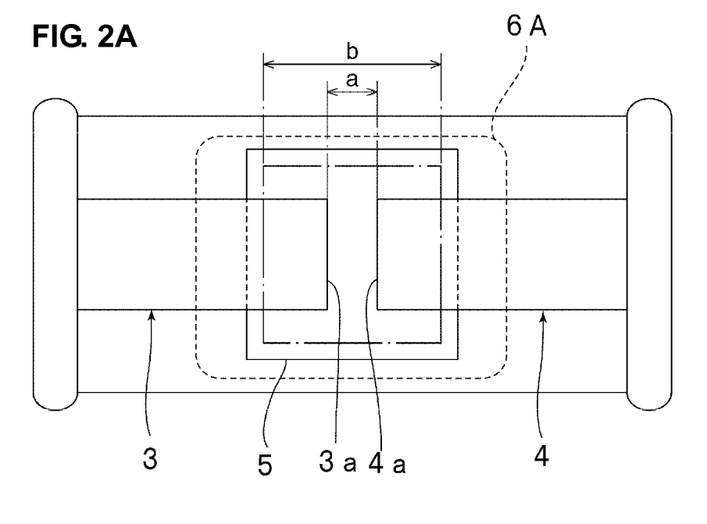
FIG. 2A is a sectional plan view of an ESD protection device according to a second preferred embodiment of the present invention.
Figure 2B:
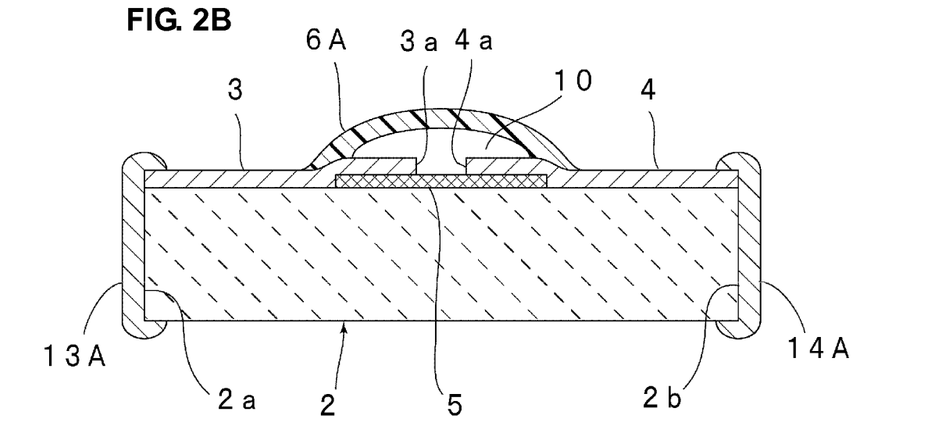
FIG. 2B is a front sectional view of the ESD protection device according to the second preferred embodiment of the present invention.

In this preferred embodiment, the thermosetting resin-cured layer 6 is preferably formed so as to cover the entire or substantially the entire surface of the insulating ceramic substrate 2 and to have a substantially rectangular shape, for example. However, as shown in FIGS. 2A and 2B that illustrate a modification of a preferred embodiment of the present invention, a thermosetting resin may preferably be potted only in the periphery of a region in which the cavity 10 is formed, and then cured by heating to form a thermosetting resin-cured layer 6A. As shown in FIG. 2B, in this modification, the thermosetting resin-cured layer 6A is preferably formed above the central region of the upper surface of the insulating ceramic substrate 2. The thermosetting resin-cured layer 6A is preferably formed above a region that includes a portion in which the discharge supporting electrode 5 is formed. As a result, the essential portion in which the edges 3a and 4a of the first and second discharge electrodes 3 and 4 and the discharge supporting electrode 5 are formed can be covered with the thermosetting resin-cured layer 6A with certainty. Thus, the essential portion is sealed with certainty and the reliability is effectively improved.

In the ESD protection device 1 shown in FIG. 2B, a first terminal electrode 13A is preferably formed so as to be connected to the first discharge electrode 3 and so as to cover the end surface 2a of the insulating ceramic substrate 2. A second terminal electrode 14A is preferably formed so as to be connected to the second discharge electrode 4 and so as to cover the end surface 2b of the insulating ceramic substrate 2.

Figure 3:
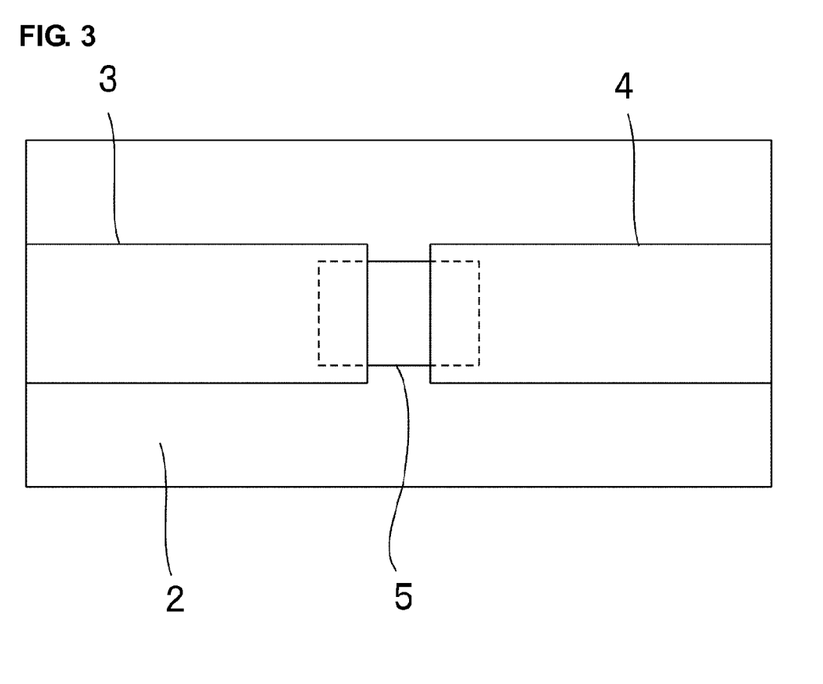
FIG. 3 is a plan view for describing a modification of the ESD protection device according to a preferred embodiment of the present invention.

In FIG. 1A, a direction perpendicular to the direction in which the first and second discharge electrodes 3 and 4 face each other is assumed to be a width direction. As shown in FIG. 1A, the size of the discharge supporting electrode 5 in the width direction is preferably set to be greater than the widths of the first and second discharge electrodes 3 and 4. The size of the discharge supporting electrode 5 in the width direction is preferably greater than the widths of the first and second discharge electrodes 3 and 4. Thus, creeping discharge is easily generated between the first and second discharge electrodes 3 and 4 due to the discharge supporting electrode 5. However, as shown in FIG. 3 that illustrates another modification of a preferred embodiment of the present invention, the size of the discharge supporting electrode 5 in the width direction may preferably be smaller than the widths of the first and second discharge electrodes 3 and 4.

Figure 4:
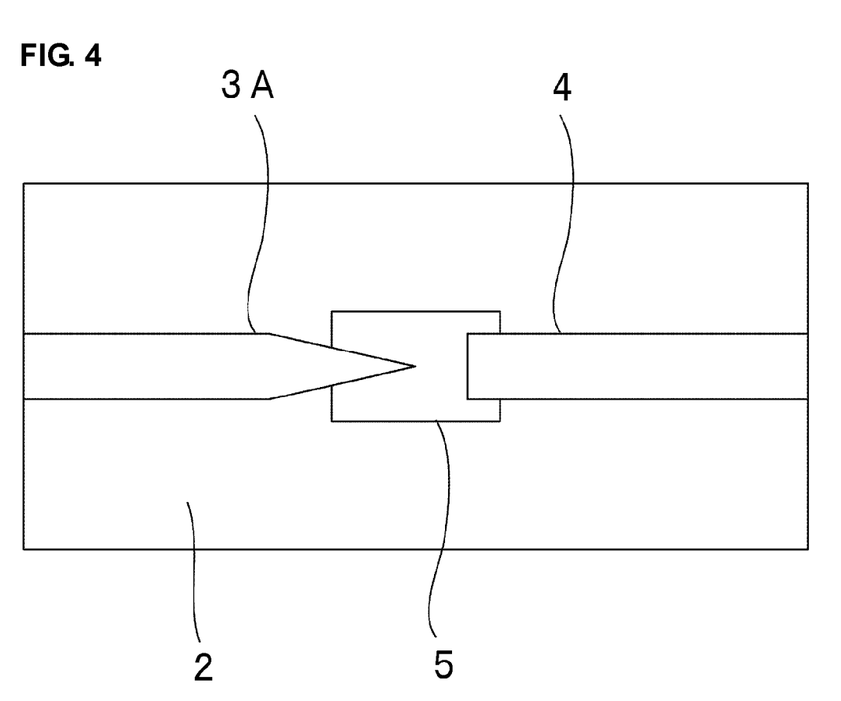
FIG. 4 is a plan view for describing another modification of the ESD protection device according to a preferred embodiment of the present invention.

As shown in FIG. 4, the first discharge electrode 3A may preferably include a pointed tip. The shapes of the first and second discharge electrodes 3 and 4 can be suitably changed in such a manner.

In the production method described above, the case in which a paste used to form a discharge supporting electrode 5 is applied, an electrode paste used to form first and second discharge electrodes 3 and 4 is applied, and the pastes are simultaneously fired has been described. However, after a paste used to form a discharge supporting electrode 5 is applied and then fired, an electrode paste used to form first and second discharge electrodes 3 and 4 may be applied and then fired.

In other words, in addition to the firing step of forming the discharge supporting electrode 5, a firing step of forming the first and second discharge electrodes 3 and 4 may be performed.

In the production method described above, the case in which a paste used to form a discharge supporting electrode 5 is printed and then an electrode paste used to form first and second discharge electrodes 3 and 4 is printed in order to obtain the structure shown in FIG. 1B has been described. However, the printing of the pastes may be performed in the reverse order. Even in this case, the firing step of obtaining the discharge supporting electrode 5 and the firing step of obtaining the first and second discharge electrodes 3 and 4 may be performed simultaneously or separately.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
    an insulating ceramic substrate excluding a glass ceramic substrate;
    a thermosetting resin-cured layer provided on the insulating ceramic substrate, the thermosetting resin-cured layer including a cavity arranged to face an interface between the thermosetting resin-cured layer and the insulating ceramic substrate;
    first and second discharge electrodes provided on the insulating ceramic substrate and including respective edges that face each other with a gap therebetween, the edges and the gap being exposed in the cavity; and
    a discharge supporting electrode arranged so as to electrically connect the first and second discharge electrodes to each other, the discharge supporting electrode including a ceramic material and metal particles whose surfaces are coated with insulating inorganic material powder.

2. The ESD protection device according to claim 1, wherein the ceramic material included in the discharge supporting electrode includes semiconductor particles.

3. The ESD protection device according to claim 1, wherein the thermosetting resin-cured layer is a cured layer of a thermosetting resin that is provided in a portion of an upper surface of the insulating ceramic substrate.

4. The ESD protection device according to claim 1, wherein the thermosetting resin-cured layer is a thermosetting resin-cured layer laminated over an entire or substantially an entire upper surface of the insulating ceramic substrate.

5. The ESD protection device according to claim 1, wherein the insulating ceramic substrate is an alumina substrate.

6. A method for producing an ESD protection device comprising:
    a step of preparing an insulating ceramic substrate excluding a glass ceramic substrate;
    a step of applying a paste used to form a discharge supporting electrode on the insulating ceramic substrate, the paste including a ceramic material and metal particles whose surfaces are coated with insulating inorganic material powder;
    a step of applying an electrode paste used to form first and second discharge electrodes on the insulating ceramic substrate;
    a step of firing the paste used to form the discharge supporting electrode so as to form the discharge supporting electrode;
    a step of firing the electrode paste used to form the first and second discharge electrodes so as to form the first and second discharge electrodes;
    a step of providing a material used to form a cavity in a region including respective edges of the first and second discharge electrodes and a gap provided between the edges, the material used to form the cavity being a material that is eliminated by heating;
    a step of providing a thermosetting resin on the insulating ceramic substrate in a region including the region in which the material used to form the cavity has been provided; and
    a step of, by heating, curing the thermosetting resin and eliminating the material used to form the cavity so as to form the cavity.

7. The method according to claim 6, wherein the ceramic material included in the discharge supporting electrode is made of semiconductor particles.

8. The method according to claim 6, wherein the step of firing the paste used to form the discharge supporting electrode and the step of firing the electrode paste used to form the first and second discharge electrodes are simultaneously performed.

9. The method according to claim 6, wherein the step of firing the paste used to form the discharge supporting electrode and the step of firing the electrode paste used to form the first and second discharge electrodes are separately performed.

10. The method according to claim 6, wherein the step of providing the thermosetting resin is performed by potting a thermosetting resin on the insulating ceramic substrate.

11. The method according to claim 6, wherein the step of providing the thermosetting resin is performed by coating an entire or substantially an entire upper surface of the insulating ceramic substrate with a thermosetting resin layer.

12. The method according to claim 6, wherein the insulating ceramic substrate is an alumina substrate.

\* \* \* \* \*